United States Patent [19]

Horton et al.

[11] Patent Number: 4,933,808
[45] Date of Patent: Jun. 12, 1990

[54] SOLDERLESS PRINTED WIRING BOARD MODULE AND MULTI-MODULE ASSEMBLY

[75] Inventors: Roald N. Horton, Severna Park; David B. Harris, Columbia; Robert A. Bourdelaise, Crofton, all of Md.

[73] Assignee: Westinghouse Electric Corp., Pittsburgh, Pa.

[21] Appl. No.: 350,862

[22] Filed: May 11, 1989

[51] Int. Cl.⁵ .................. H05K 7/20; H01L 23/36
[52] U.S. Cl. .................. 361/336; 361/388; 361/403; 439/73; 165/80.3
[58] Field of Search .............. 361/381, 383, 386, 388, 361/389, 400, 403; 439/70, 71, 73, 76; 165/73, 80.1, 80.2, 80.3

[56] References Cited

U.S. PATENT DOCUMENTS

| | | | |
|---|---|---|---|
| 3,335,327 | 8/1967 | Damon et al. | 361/403 |
| 3,877,064 | 4/1975 | Scheingold et al. | 361/403 |
| 4,342,069 | 7/1982 | Link | 361/403 |
| 4,506,938 | 3/1985 | Madden . | |
| 4,513,353 | 4/1985 | Bakermans et al. | 361/399 |
| 4,574,331 | 3/1986 | Smolley | 361/393 |
| 4,581,679 | 4/1986 | Smolley | 361/395 |
| 4,648,666 | 3/1987 | Lovell . | |
| 4,655,524 | 4/1987 | Etzel . | |
| 4,658,331 | 4/1987 | Berg | 361/403 |
| 4,676,564 | 6/1987 | Mitchell, Jr. | 439/77 |
| 4,692,790 | 9/1987 | Oyamada | 357/79 |
| 4,699,593 | 10/1987 | Grabbe et al. | 439/71 |
| 4,703,984 | 11/1987 | Mitchell, Jr. | 439/70 |
| 4,733,172 | 3/1988 | Smolley | 324/158 P |
| 4,769,557 | 9/1988 | Houf et al. | 361/388 |
| 4,770,242 | 9/1988 | Daikoku et al. | 361/386 |

FOREIGN PATENT DOCUMENTS 63-32958 12/1988 Japan .

OTHER PUBLICATIONS

European Patent Application Publication No. 0150928-A2 Published 8/7/85 entitled "A Compliant Interconnection Device and Assembly Method of Manufacture, and of Micro Interconnection Casting".

Great Britain Patent Application No. GB 2,135,525A published 8/30/84 entitled "Heat Dissipating Chip Carrier Substrates".

Primary Examiner—Roy N. Envall, Jr.
Attorney, Agent, or Firm—J. G. Porcelli

[57] ABSTRACT

A solderless printed wiring board module for receiving and securing surface mounted solderless electronic component carrier and electronic components without carrier upon a printed wiring board, the module also providing a heat transfer path to a surface away from the printed wiring board and the module further adaptable to electrical and mechanical attachment to similar modules placed adjacent to said module to form a multi-module assembly.

13 Claims, 7 Drawing Sheets

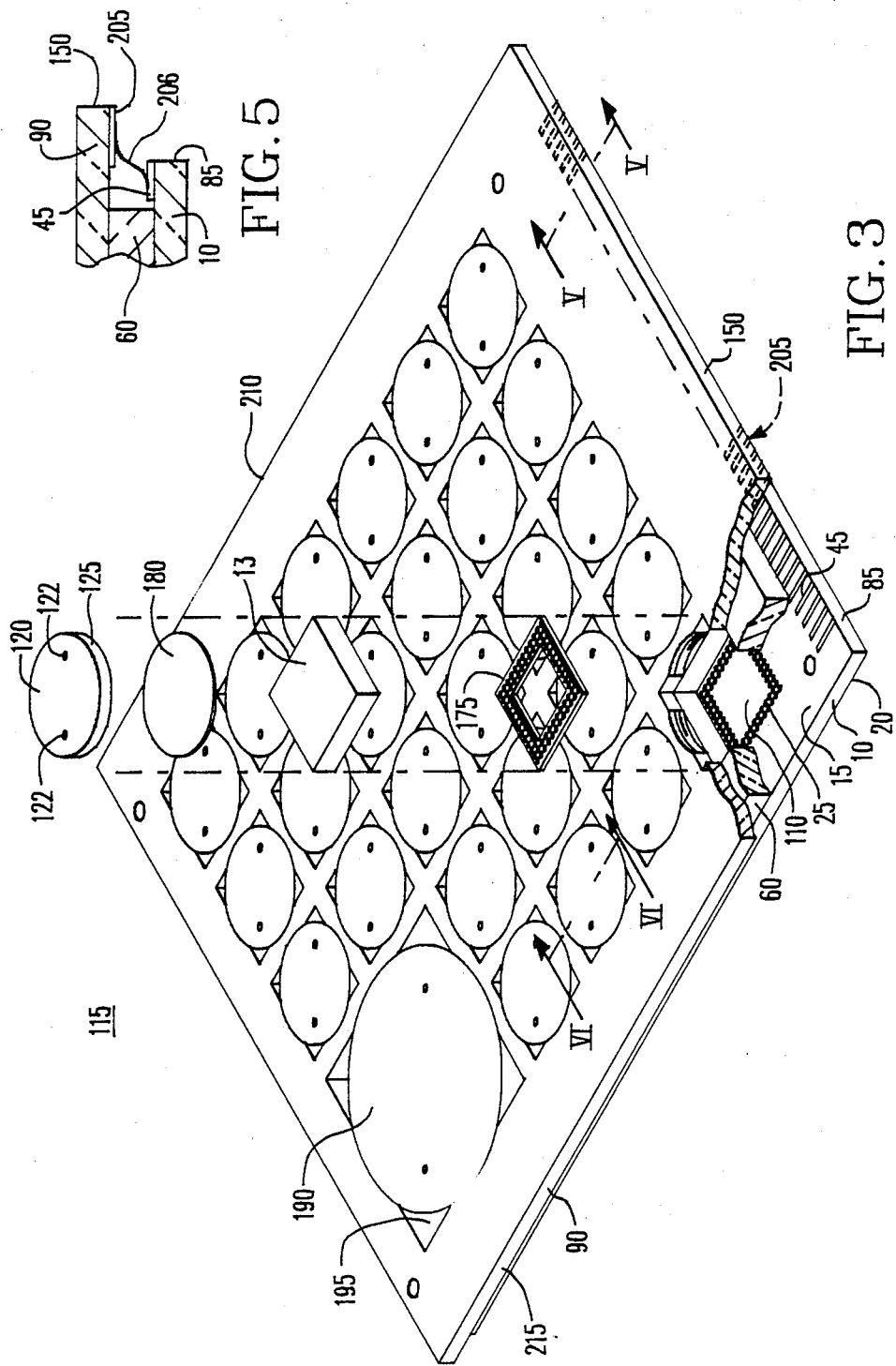

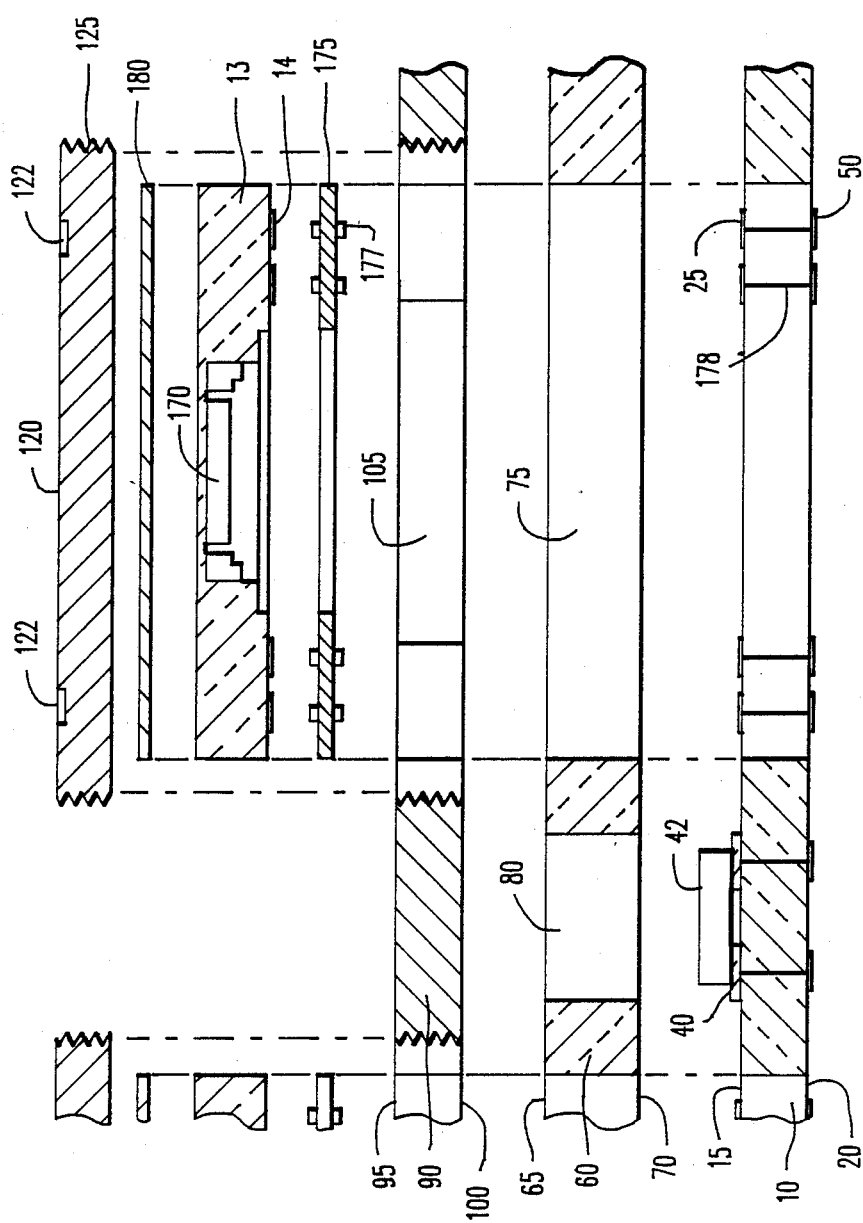

SOLDERLESS PRINTED WIRING BOARD MODULE AND MULTI-MODULE ASSEMBLY

CROSS-REFERENCE TO RELATED APPLICATIONS

This application is related to the copending U.S. Pat. application Ser. No. 350872, entitled, "Cavity-Down Chip Carrier with Pad Grid Array", filed May 11, 1989.

BACKGROUND OF THE INVENTION

This invention relates to printed wiring boards and more specifically to printed wiring boards using solderless surface mounted devices.

Surface mounted devices (SMDs) are electronic components that are designed to sit on the surface of a printed wiring board (PWB) or another compatible substrate. Components such as resistors, capacitors, diodes, transistors and integrated circuits (IC) may be designed as SMDs and, as such, have either no leads but flat interfacing surfaces or very short leads. The interfacing surfaces or the short leads of these components serve as contact pads which align with corresponding electrical connections on a PWB. For purposes of this discussion, reference will be made only to contact pads on an SMD which could refer to flush interfacing surfaces having no protruding leads or could refer to short leads.

Typically the components are mounted or fabricated within a ceramic or plastic carrier to provide a desired configuration having contact pads on the external surface of the carrier which are electrically connected to the component contained therein.

The advantages of SMDs are numerous. The size of these devices may be 30 to 60% smaller than the traditional leaded components they replace. The holes within the PWBs which accept the leads of leaded components are no longer necessary when utilizing SMDs. For this reason, not only may SMDs be mounted closer together, but SMDs may also be mounted on each side of a PWB. Because of these factors, the overall size and weight of a populated PWB is less than that of a PWB using leaded components.

While surface mount technology has existed for some time, by and large surface mounted devices generally are attached to a PWB using solder. The use of solder to secure SMDs, just as with many other electronic devices, has a number of associated problems. First of all, in order for solder to flow between the SMD and the PWB, the solder must be heated. When the solder is heated, typically due to their proximity the SMD and the PWB are also heated. Occasionally, this high temperature damages the surface mounted device thereby reducing the device reliability.

Secondly, after an SMD is soldered to a PWB, inspection of the newly created solder joint is necessary to verify the integrity of the joint. Depending on the location of the solder joint and the configuration of the SMD, this inspection process, if inspection is even possible, can be difficult and time consuming.

Finally, whenever solder is used, there exists the possibility that the solder may inadvertently be deposited or spattered onto another component or the PWB thereby resulting in contamination to the component or PWB.

Aside from the negative effects associated with the use of solder on SMDs, some SMDs, such as those housing an IC chip, may generate a significant amount of heat that must be dissipated in some manner to avoid damage to the device. Typically, this dissipation is done utilizing a heat sink attached to the opposite side of the PWB from that which the device is attached. Heat dissipation from the device occurs primarily by conductive heat transfer from the device through the PWB and into the heat sink. Given a PWB of a significant thickness, the conductive heat transfer from the device to the heat sink may be so limited that the controlling factor in selection of the chip may be the heat it generates as opposed to operational capability.

Furthermore, the placement of SMDs onto a PWB requires precision such that the contact pads of the SMD are aligned with and contact the associated pads on a PWB. As the number of contact pads on the SMD increases and the pitch between pads decreases, the level of precision with which the SMD must be located upon the PWB also increases to a point where great care must be taken to place the SMD in the proper location on the PWB surface.

It is an object of this invention to provide a PWB assembly whereby SMDs may be mounted and held in contact with a PWB using a device that applies pressure on the SMD forcing it against the PWB such that no solder is used, thereby avoiding the problems of inspection, solder reflow heat and the contamination associated with the use of solder to attach SMDs to PWBs.

It is another object of this invention to provide an assembly whereby the heat transfer from a component may be increased and will not be dependent on the thickness of the PWB to which it is attached.

It is still another object of this invention to provide a PWB assembly which permits placement of an SMD onto a PWB without the necessity of precise initial alignment before the SMD contacts the PWB surface.

SUMMARY OF THE INVENTION

A solderless PWB module is comprised of an integrated circuit chip carrier package comprised of a base of an electrically insulating material having planar top and bottom surfaces with a thickness therebetween and a central cavity extending through the top surface to a distance above the bottom surface thereby defining a cavity floor upon which an integrated circuit chip having a plurality of chip connections extending therefrom is mounted, and a cavity wall and at least one bonding ledge having an outer surface and extending from the cavity floor along the cavity wall, a plurality of vias of electrically conductive material and with cross-sectional areas within the base, each with a first and a second end, the first ends of the vias terminating at and penetrating through the base top surface at approximate locations in a predetermined pattern and the second ends of the vias terminating at and penetrating through the bonding ledge outer surface, electrical connection means extending from each of the chip connections to the second end of a corresponding via such that an electrically conductive path is established between the chip connections and corresponding vias terminating at the base top surface and a cover plate, with an area approximately equal to the cavity area, secured at the base top surface such that the cavity is fully enclosed.

BRIEF DESCRIPTION OF THE DRAWINGS

FIG. 3 is an isometric view of a solderless PWB module and further shows an exploded view of the contents of a typical module cavity.

FIG. 5 shows a section view of the region containing jumper wire between the PWB and the heat conductive member surface.

FIG. 6 shows an exploded section view of a portion of the module in FIG. 3.

DESCRIPTION OF THE PREFERRED EMBODIMENT

Figure 1:
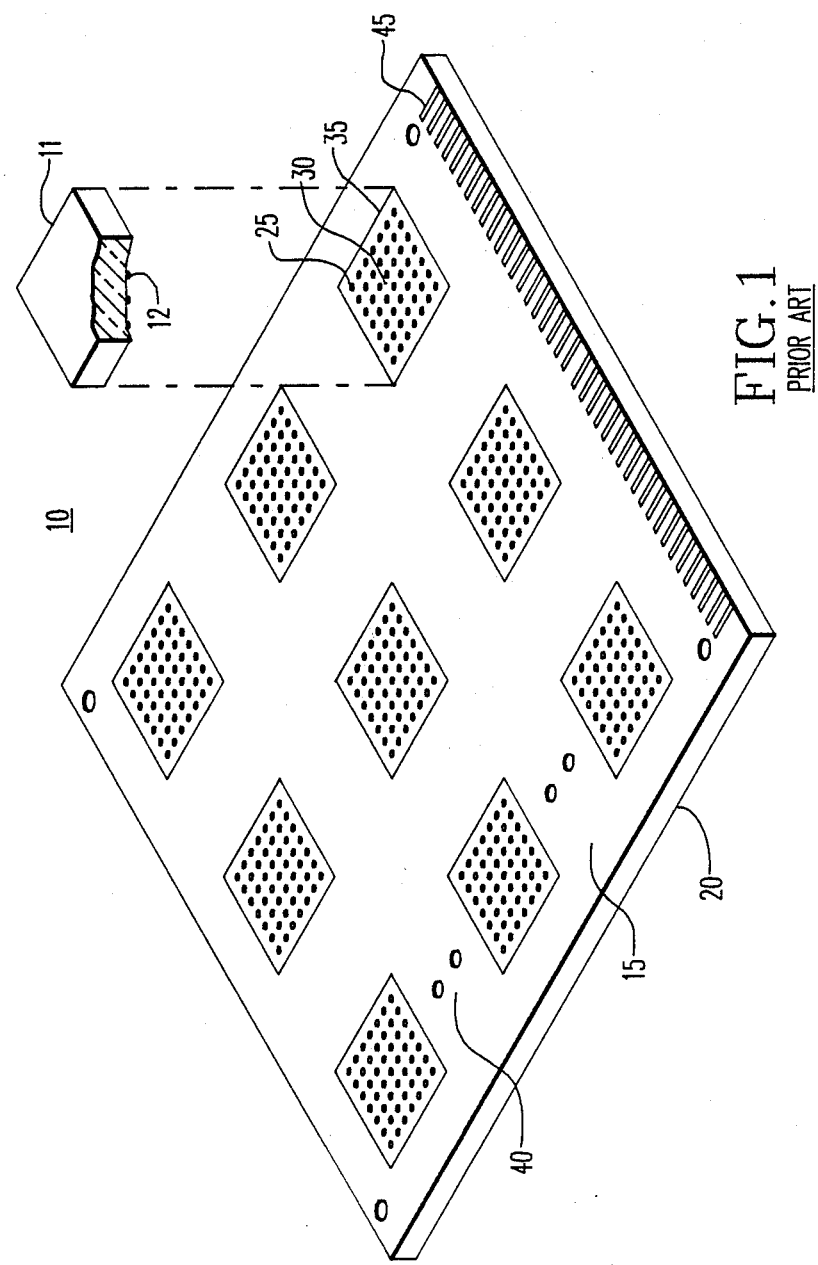
FIG. 1 is prior art and shows the top surface of a PWB with a component carrier.

FIG. 1, which is prior art, illustrates a printed wiring board 10 (PWB) having a first surface 15, a second surface 20, which is opposite to that of the first surface 15, and a thickness therebetween. Typically, electronic components within carriers, or SMDs, are mounted upon the surface of a PWB 10, such as the component carrier 11 shown in FIG. 1. For this reason, the first surface 15 of the PWB 10 has upon it electrically conductive carrier interconnect pads 25 in predetermined pad patterns 30 within defined areas 35 such that the contact pads 12 of mating electronic component carriers (11 in FIG. 1), are aligned with and contact the interconnect pads 25. While the area 35 is outlined with a rectangular shape as a solid line on the PWB surface 15, this outline is only for illustrative purposes and would not be necessary on the PWB surface 15.

Surface mounted devices (SMD) typically are electronic components mounted within carriers. However, occasionally, electronic components are mounted directly to the PWB such that component carriers are not utilized. Electronic component interconnect pads 40, as opposed to carrier interconnect pads 25, are typically fewer and in a simpler pad pattern than those patterns 30 for the electronic component carriers. Generally the electronic components not contained within a carrier are secured to the PWB with epoxy in a solderless environment, or with solder in other situations, and in this sense are not easily removable but furthermore these components tend to be more reliable and less likely to fail and require removal. On the other hand the component carriers, as will be seen, are mounted without epoxy or solder so that removal and replacement is relatively easy and so that the components within the carrier may be easily tested.

For external electrical connections from another source to the PWB 10, the PWB 10 has upon the first surface 15 a set of connector pads 45 along a length of the surface. The PWB 10 may have only a single layer such that all of the components related to the carrier interconnect pads 25 and the component interconnect pads 40 on the first surface 15 are connected to one another or to the connector pads 45 by circuitry on the first surface 15 of the PWB 10. However, typically PWBs are multilayer and as such multilevels of circuitry exist within one PWB. The PWB 10 shown in FIG. 1 may be a single layer PWB or a multilayer PWB.

The second opposite surface 20 of the PWB 10 is identical to the first surface 15 of the PWB 10. Directly opposite each pad pattern 30 on the first surface 15 are similar pad patterns on the second surface 20 such that each carrier interconnect pad 25 is attached to a via which extends through the thickness of the PWB 10 to the opposite second surface 20. In this manner, a component mounted upon the first surface 15 may be electrically tested relative to its interaction with surrounding components on the PWB 10 utilizing test pads (not shown) on the second surface 20 which are similar to the interconnect pads 25 and 40 on the first surface 15. Inspection of a component mounted to the first surface is possible, without dismounting the component through the use of the test pads. While the components without carriers attached to the PWB first surface 15 may also have test pads on the second surface 20, only the carrier test pads will be discussed with the understanding that, if desired, there could also be test pads for the components without carriers. Furthermore, a second set of connector pads (not shown) located upon the second surface 20 along a length of its surface opposite to those pads 45 on the first surface 15 may be utilized in conjunction with the connector pads 45 on the first surface 15. However, the connector pads 45 on the first surface 15 of the PWB 10 may be entirely adequate for external connectors on the PWB 10 and therefore second surface connector pads may be unnecessary.

Note that while the second surface has been described as having test pads and second surface connector pads, the PWB 10 may still be operable without any test pads on the second surface 20. The electronic components are still testable but would require removal from the PWB surface 15.

Figure 2:
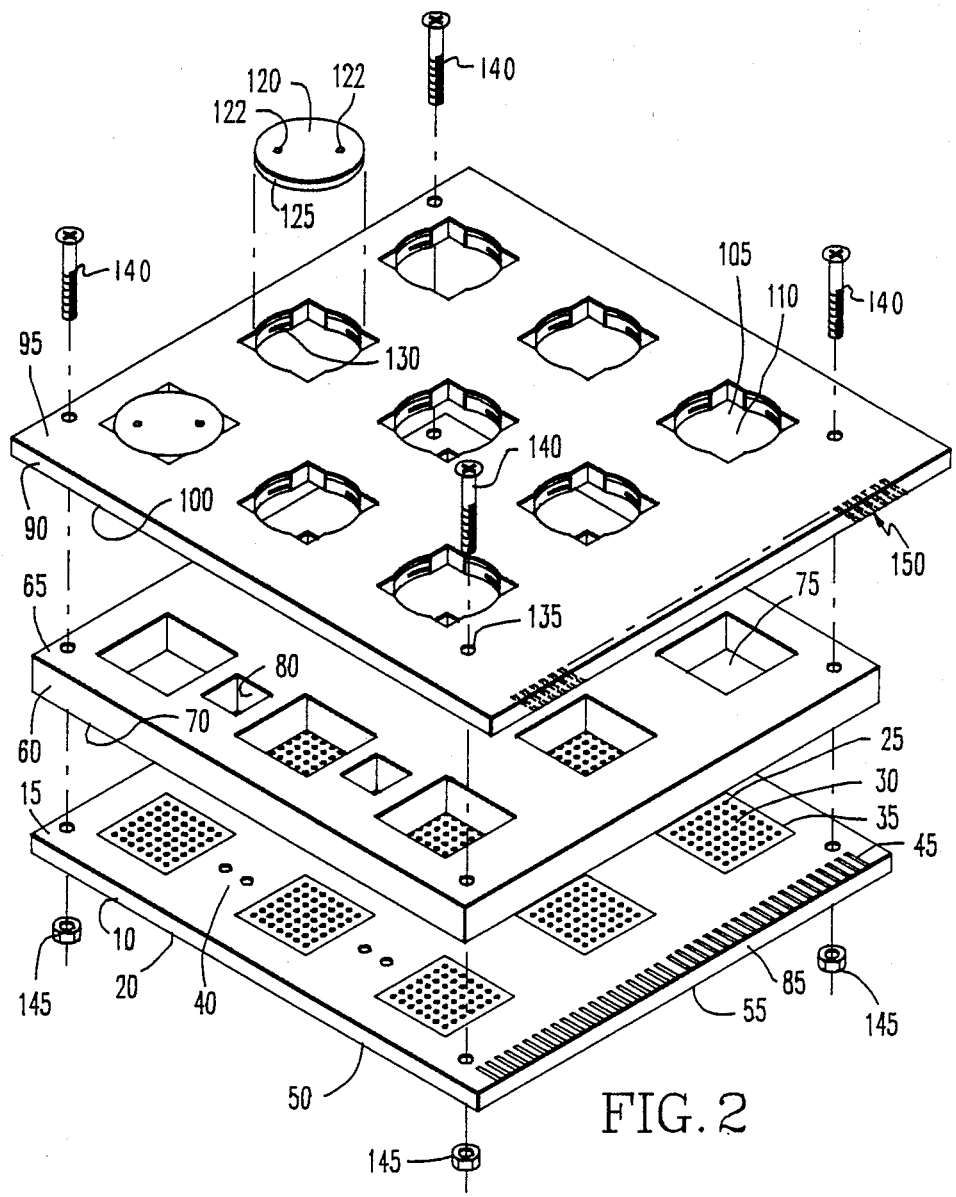
FIG. 2 shows an exploded isometric view of an unpopulated solderless PWB module.

While the PWB 10 in FIG. 1 is prior art, the apparatus for attaching electronic component carriers and mounting electronic components to the PWB relates to the invention and is shown in FIG. 2. The PWB 10, shown in FIG. 1, is now shown in FIG. 2 with the carrier interconnect pads 25 upon the first surface 15 of the PWB 10. The carrier interconnect pads 25 are in predetermined patterns 30 which occupy an area 35 on the first surface 15 of the PWB 10. Furthermore, connector pads 45 along a length of the first surface 15 of the PWB 10 provide connections for external connectors to the PWB 10. Electronic component interconnect pads 40 are also shown upon the first surface 15. The PWB has a thickness and a second surface 20 on the side opposite that of the first surface 15.

The PWB 10 has a second surface 20 similar to that of the first surface 15. Test pads (not shown) occupy a portion of the second surface 20 directly opposite to the carrier interconnect pads 25 shown on the first surface 15. Furthermore, second surface connector pads (not shown) may be located on the second surface 20 of the PWB 10. As indicated, the interconnect pads 25 form predetermined pad patterns 30 on the first surface 15 of the PWB 10 which are compatible with the contact pads (12 of FIG. 1) of electronic component carriers (item 11 of FIG. 1). Electronic component interconnect pads 40, are also located on the first surface 15 of the PWB 10 for the mounting of components which are not enclosed within a carrier.

A planar dielectric spacing member 60 having a first surface 65, a thickness and a second surface 70 contains at least one carrier aperture 75, each aperture having a shape and an area to accept an electronic component carrier, such as item 11 in FIG. 1, within the carrier aperture 75. The dielectric spacing member may also be heat conductive. With this in mind the material of the member 60 may be plastic. The carrier aperture 75 is aligned over a pattern 30 of interconnect pads 25. The dielectric spacing member 60 second surface 70 is placed adjacent to and in contact with the PWB 10 first surface 15. An electronic component carrier (11 of FIG. 1) having contact pads (12 of FIG. 1) that are associated with a specific pattern 30 of interconnect pads 25 may be inserted into the carrier aperture 75 and thereby aligned with the interconnect pads 25 such that the contact pads 12 of the electronic component carrier correctly align with the interconnect pads 25. Each carrier aperture 75 is specifically designed for an associated electronic component carrier.

As indicated in FIG. 2 for each interconnect pad pattern 30, there is an associated carrier aperture 75 within the dielectric spacing member 60. Furthermore, the dielectric spacing member 60 may contain components without carriers, such as a capacitor, and the member 60 then would have component apertures 80 which have the approximate area and shape of the electronic component contact pads 40 on the PWB first surface 15 such that electronic components may be inserted into the component apertures 80 and secured to the interconnect pads 40. In order to permit external electrical connectors to be attached to the PWB 10 along the connector pads 45, the PWB 10 must have an edge 85 which extends slightly beyond that edge of the dielectric spacing member 60.

A planar heat conductive member 90 having a first surface 95, a thickness and an opposite second surface 100 has carrier apertures 105 of a shape and area approximately equal to that of an associated electronic component carrier such as that shown in FIG. 1, item 11. The heat conductive member may be made of a material such as aluminum which may provide conductive heat transfer through its thickness. It is not necessary that the member 90 be electrically conductive. Each carrier aperture 105 of the heat conductive member 90 is aligned with an associated spacing member carrier aperture 75 such that a cavity 110 having walls defined by the spacing member carrier aperture 75 and carrier aperture 105 of the heat conductive member 90 will readily receive an electronic component carrier 13 and correctly position it relative to the associated interconnect pads 25 on the PWB 10 first surface 15.

Since the PWB module is intended to be a solderless apparatus for SMDs, a securing means is provided to hold the electronic component carrier 13 contact pads against the associated interconnect pads 25. The securing means shown in FIG. 2 is comprised of a compressing cover 120, made of a thermally conductive material, which is secured to the heat conductive member 90 to provide pressure against an electronic component carrier 13 such that the carrier contact pads are pressed against the related interconnect pads 25.

A preferred embodiment for the securing means involves the compressing cover 120 having a threaded edge 125. Each compressing cover 120 is associated with a carrier aperture 105 in the heat conductive member 90. Mating threads 130 within the wall of the carrier aperture 105 provide for a threaded connection between the compressing cover 120 and the heat conductive member 90 and spanner sockets 122 provide indentations within the compressing cover 120 by which the cover 120 may be threaded into the heat conductive member 90. An electronic component carrier 13 may therefore be inserted within the cavity 110 and utilizing the compressing cover 120 may be secured within the heat conductive member such that the contact pads 12 of the electronic component carrier 13 is pressed against the PWB 10 first surface 15 and the associated interconnect pads 25.

The second surface 100 of the heat conductive member 90 is adjacent to and in contact with the first surface 65 of the dielectric spacing member 60. Each of the carrier apertures 105 of the heat conductive member 90 are aligned with an associated carrier aperture 75 within the dielectric spacing member 60. The PWB 10, the dielectric spacing member 60 and the heat conductive member 90 are all attached to one another in a fixed relationship. While this attachment may be performed in a variety of ways, the preferred embodiment involves the use of epoxy between the PWB 10, the dielectric spacing member 60 and the heat conductive member 90 surfaces. Another embodiment involves at least two holes 135 through the heat conductive member 90, the dielectric spacing member 60 and the PWB 10. A screw 140 having a length greater than the thickness of the three members is extended through each hole 135 and secured at the end with a mating nut 145. A single hole, screw and nut may be utilized, however alignment becomes easier with at least two of each.

An alternate method of attaching the compressing cover 120 onto the heat conductive member 90 involves the use of epoxy to glue the compressing cover 120 within the heat conductive member 90. In this embodiment, the compressing cover 120 must be of a shape such that it may fit within a carrier aperture 105 of the conductive member 90.

Another alternate method involves the use of a compressing cover 120 having a shape and an area approximately equal to that of a related carrier aperture 105 of the heat conductive member 90. The compressing cover 120 may be forced into the carrier aperture 105 such that friction between the compressing cover 120 and the carrier aperture 105 walls will be sufficient to hold the electronic component carrier in place.

Note in FIG. 2 that while the PWB 10 edge extends beyond that of the dielectric spacing member 60, an edge 150 of the heat conductive member 90 extends beyond both the edge of the dielectric spacing member 60 and the edge 85 of the PWB 10. This will be addressed with the discussion of FIG. 3.

FIG. 3 shows the exploded isometric view in FIG. 2 assembled into a PWB module 115. Just as shown in FIG. 2 the PWB 10 has interconnect pads 25 upon its first surface 15 and has connector pads 45 upon the first surface 15 of an extended edge 85 of the PWB 10. Just as in FIG. 2 a dielectric spacing member 60 is adjacent to and contacting the PWB 10. A heat conductive member 90 is adjacent to and in contact with the dielectric spacing member 60. Through the spacing member 60 and the heat conductive member 90 is a typical cavity 110. The base of the cavity 110 is defined by the first surface 15 of the PWB 10. The walls of the cavity 110 are defined by the carrier aperture (75 in FIG. 2) through the dielectric spacing member 60 and the carrier aperture (105 in FIG. 2) through the heat conductive member 90, as shown in FIG. 2.

FIG. 3 shows a component carrier 13 which is different than that shown as item 11 in FIG. 1. The carrier 13 is shown in more detail in FIG. 4. While the contact pads 12 of carrier 11 in FIG. 1 extend across the surface of the carrier 13, the contact pads 14 of carrier 13 are situated close to the perimeter of the carrier 13. This type of carrier 13 is typical of a carrier known as a cavity-down chip carrier with a pad grid array in which the chip is mounted within the carrier 13 away from the contact pads 14 The different pattern of the contact pads 14 necessitates a different component pads pattern for the component interconnect pads 25 in FIG. 3. As will be shown the design of the PWB module 115 is especially conducive to providing heat transfer from this type of carrier.

Figure 4:
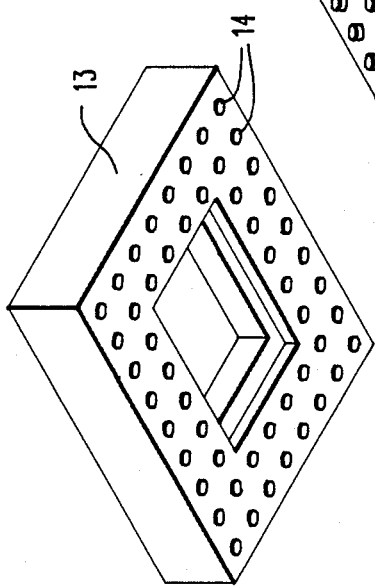
FIG. 4 illustrates a typical surface mounted electronic component carrier.

Note however that a variety of component carriers, such as carrier containing components other than IC chips, may be utilized with the PWB module 115 and FIG. 4 represents only one of these types.

As mentioned, the electronic component carrier 13 has contact pads in a mating pattern to that pattern of the interconnect pads 25 on the first surface 15 of the PWB 10. Because of the potential for deviations from a planar surface on the bottom of the electronic component carrier 13 and on the first surface 15 of the PWB 10, there exists the possibility that all of the contact pads on the electronic component carrier 13 may not contact all of the interconnect pads 25 on the first surface 15 of the PWB 10. For this reason, a component compliant solderless interface 175 is placed between the electronic component carrier 13 and the PWB first surface 15.

Figure 8:
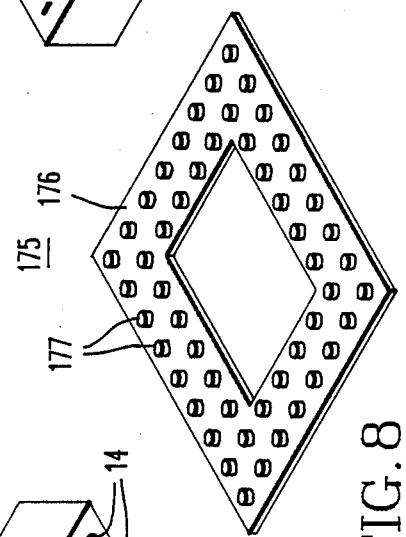
FIG. 8 illustrates the configuration of one type of compliant solderless interface that would be used with an electrical component carrier such as that shown in FIG. 4.

The compliant solderless interface 175 is further illustrated in FIG. 8. An insulating planar frame 176 contains individual wads of finely woven electrically conductive wire inserted into holes in the frame 176 which form contact pads 177. The pads 177 are arranged to align with the PWB carrier interconnect pads 25 and the component contact pads 14. The component compliant interface 175 is manufactured under the tradename "CIN::APSE" by the Cinch company. Other types of compliant solderless interfaces are commercially available and may be utilized as long as electrical contact between the carrier interconnect pads 25 and the component contact pads 14 is provided.

Just as there may be non-planar surfaces between the electronic component carrier 13 and the first surface 15 of the PWB 10 there also may be non-planar surfaces between the compressing cover 120 and the electronic component carrier 13 While this is not critical for electrical contact between the electronic component carrier 13 and the first surface 15 of the PWB 10, it is important if the electronic component within the carrier 13 operates at a high temperature and therefore requires heat removal from the electronic component carrier 13. If the fit between the compressing cover 120 and the electronic component carrier 13 is not completely flush then there will be air gaps between the carrier 13 and the component cover 120. Since the component carrier 13 is not in direct contact with the heat conductive member 90, the compressing cover 120 acts as the only conduit for heat transfer from the component carrier 13 to the heat conductive member 90. Without a flush contact between these two, air gaps exist in those non-contact regions thereby severely hampering conductive heat transfer between the carrier 13 and the cover 120. For this reason, a thermally conductive interface 180 is placed between the compressing cover 120 and the electronic component carrier 13. The thermally conductive interface is a compliant layer of thermally conductive material that may be compressed between the cover 120 and the carrier 13 such that the conductive interface 180 will conform to and contact the cover 120 and the carrier 13 thereby removing air gaps between the cover 120 and the carrier 13 and providing conductive heat transfer. Since conductive heat transfer still occurs between the carrier 13 and the compressing cover 120 at their areas of contact, even without the thermally compliant interface 180 the conductive heat transfer between the carrier 13 and the cover 120 may still be adequate.

Note that the compressing cover 120 is used to compress one electronic component carrier 13 against the first surface 15 of the PWB 10. However, a multicarrier compressing cover 190 may be utilized with an oversized aperture 195 of the heat conductive member 90 to secure a number of electronic component carriers within their respective cavities.

While in FIG. 1 external connections to the PWB 10 were made through the connector pads 45 located on the first surface 15 of the PWB 10, in certain instances it is beneficial to have the external electrical connection contacting connector pads mounted upon the second surface 100 of the heat conductive member 90. As shown in FIG. 3 and detailed in FIG. 5, the heat conductive member 90 has an extended edge 150. Upon the second surface 100 are connector pads 205 of the heat conductive member 90 such that there is a one-to-one correspondence between the connector pads 45 on the first surface 15 of the PWB 10 and the connector pads 205 of the heat conductive member 90 on the second surface 100 (FIG. 2) of the heat conductive member 90. Electrical connectors 206 electrically attach each connector pad 45 with a respective connector pad 205 of the heat conductive member 90. Since the heat conductive member 90 may be comprised of an electrically conductive material, it would be necessary in this case to provide electrical insulation between the pads 205 and the second surface 100 of the heat conductive member 90. As an alternative, commercially available flexible cable containing an insulated strip of parallel wires may be attached such that one end of each wire contacts a pad 45 and the other end is attached to the second surface 100 of the heat conductive member 90 to act as a jumper.

Furthermore, note that the heat conductive member 90 has two other extending edges 210 and 215. When heat is transferred from each component carrier 13 through the respective cover 120 to the heat conductive member 90, the heat must then be transferred from the heat conductive member 90. This is done by attaching heat sinks to each of the extending edges 210 and 215. Depending on the heat transfer required from the heat conducting member 90, both extending edges 210 and 215 may be attached to heat sinks or either one of the extending edges to 210 or 215 may be attached to a heat sink. Since the purpose of the extending edges 210 and 215 is solely to provide a heat sink for heat transfer, if the operating temperature of the electronic components within the carriers 13 is sufficiently low that no external heat sink is required, then there is no necessity for either extending edge 210 or extending edge 215.

FIG. 6 illustrates, in more detail, the exploded view of the four items filling the cavity in FIG. 3 and also shows an electronic component 42 directly mounted to the PWB without utilizing an electronic component carrier. The PWB 10 has upon its first surface 15 carrier interconnect pads 25 corresponding to the contact pads 14 on an electronic component carrier 13 and the first surface also has upon it electronic component interconnect pads 40 for the direct attachment of an electronic component 42. Through the spacing member carrier aperture 75 and the heat conducting member carrier aperture 105 a compliant solderless interface 175 is placed within the carrier apertures 75 and 105 such that the pads 177 of the compliant solderless interface 175 contact the interconnect pads 25 on the PWB 10. The electronic component carrier 13 having its own contact pads 14 is placed upon the compliant solderless interface 175 thereby completing electrical connections between the electronic component carrier 13 and the interconnect pads 25.

The shape and the area of the dielectric spacing member carrier aperture 75 is intentionally the same as that shape and area of the carrier 13 so that the carrier 13 contact pads, when the carrier 13 is placed within the carrier aperture 75, are automatically aligned with the interconnect pads 25. The compressing cover 120 is then secured to the heat conductive member 90 thereby forming a dependable electrical connection between the carrier contact pads 14 and the interconnect pads 25.

Figure 7:
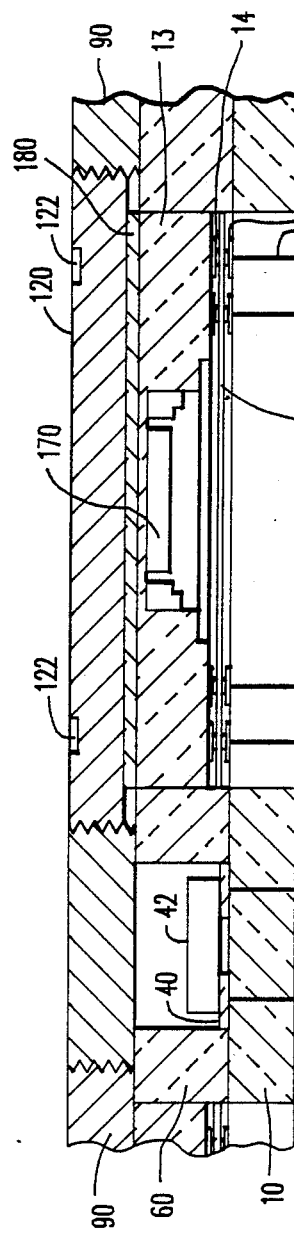
FIG. 7 shows the exploded view of FIG. 6 assembled.

The compressing cover 120 has a threaded edge 125 and the conductive member carrier aperture 105 has mating threads 130 such that the compressing cover 120 may be threaded into the carrier aperture 105 thereby compressing the carrier 13 toward the interconnect pads 25. If the electronic component operates at a sufficiently high temperature, a thermally conductive interface 180 is placed between the carrier 13 and the compressing cover 120 such that no air gaps exist between the cover 120 and the carrier 13 and conductive heat transfer is enhanced. FIG. 7 shows the exploded view of the cavity items assembled and in place on the PWB. The same item numbers as those used in FIG. 6 are utilized in FIG. 7.

Returning to FIG. 6, the electronic component 42, which may be a decoupling capacitor, is shown with its leads aligned with the electronic component contact pads 40 positioned within the electronic component aperture 80 through the dielectric spacing member 60. Note here the heat conductive member 90 acts to cover the component aperture 80 through the spacing member 60 such that the electronic component 42 is completely enclosed once the heat conductive member 90, the dielectric spacing member 60 and the PWB 10 are all attached to one another.

FIG. 7 shows the exploded view of the component 80 assembled and in place on the PWB 10. The same numbers as those used in FIG. 6 are utilized in FIG. 7. The carrier 13 in FIG. 7 is the cavity-down chip carrier with a pad grid array that was discussed earlier. An integrated circuit (IC) chip 170 is mounted on the side of the carrier opposite the carrier pads 14. In this manner the heat generated by the chip 170 must travel only the distance between the chip 170 and the heat conductive member 90, which is a much shorter path than that path through the carrier 13 body, the carrier pads 14 and through the PWB 10 to a heat sink Because of this, the PWB module design is conducive to transferring heat from cavity-down chip carriers, however note that the design clearly is not limited to this type of carrier.

Note further that test pads 50 on the second surface 20 of the PWB 10. These test pads 50 are directly connected to interconnect pads 25 on the opposite side of the PWB 10 through individual vias 178 through the width of the PWB 10. Once an electronic component carrier 13 or an electronic component 80 without a carrier is installed on the PWB 10, that component may then be tested relative to its interaction with surrounding components on the PWB 10 using the test pads 50 without the necessity of disassembling the entire module. While the vias 178 shown extending through the PWB 10 show no other electrical connections, it should be understood that within the PWB 10, circuitry may extend from one via to any other via to accomplish whatever electrical connections within the PWB are desired.

Briefly returning to FIG. 4, the underside of a typical electronic component chip carrier 13 is shown. Note the fairly planar surface of the carrier 13 which as discussed if the surface were completely planar and if the PWB 10, first surface 15 were also completely planer, then there would be no necessity for the compliant solderless interface 175 to be used. However, to compensate for slight deviations from a planar surface, the compliant solderless interface 175, shown in FIG. 8 is utilized. The electrical contacts on the compliant solderless interface 175 correspond to those contact pads 14 on the underside of the carrier 13.

Figure 9:
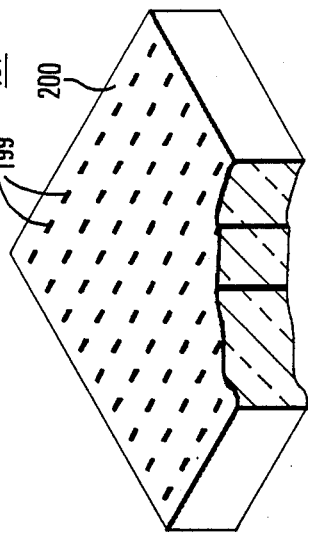
FIG. 9 shows a compliant solderless interface of the type that may be utilized for electrically connecting the PWBs of adjacent PWB modules.

Although the compliant solderless interface 175 in FIG. 8 provides a one-to-one correspondence between the contacts on the compliant solderless interface and those on the carrier 13, there are other types of compliant solderless interfaces that do not require a one-to-one contact between the electrical contacts of the compliant solderless interface and the contact pads on the carrier 13. One such alternative compliant solderless interface 197 is that design shown in FIG. 9. Uniaxial conductive wires 199 are situated in a dielectric elastomer base 200. The conductive wires 199 are placed very close together such that any contact pad 14 on the carrier 13 in all probability would contact more than one uniaxial conductive wire 199. Just as with the compliant solderless interface 175 shown in FIG. 8, the interface 197 shown in FIG. 9 may be shaped to accommodate any size carrier 13.

Figure 10:
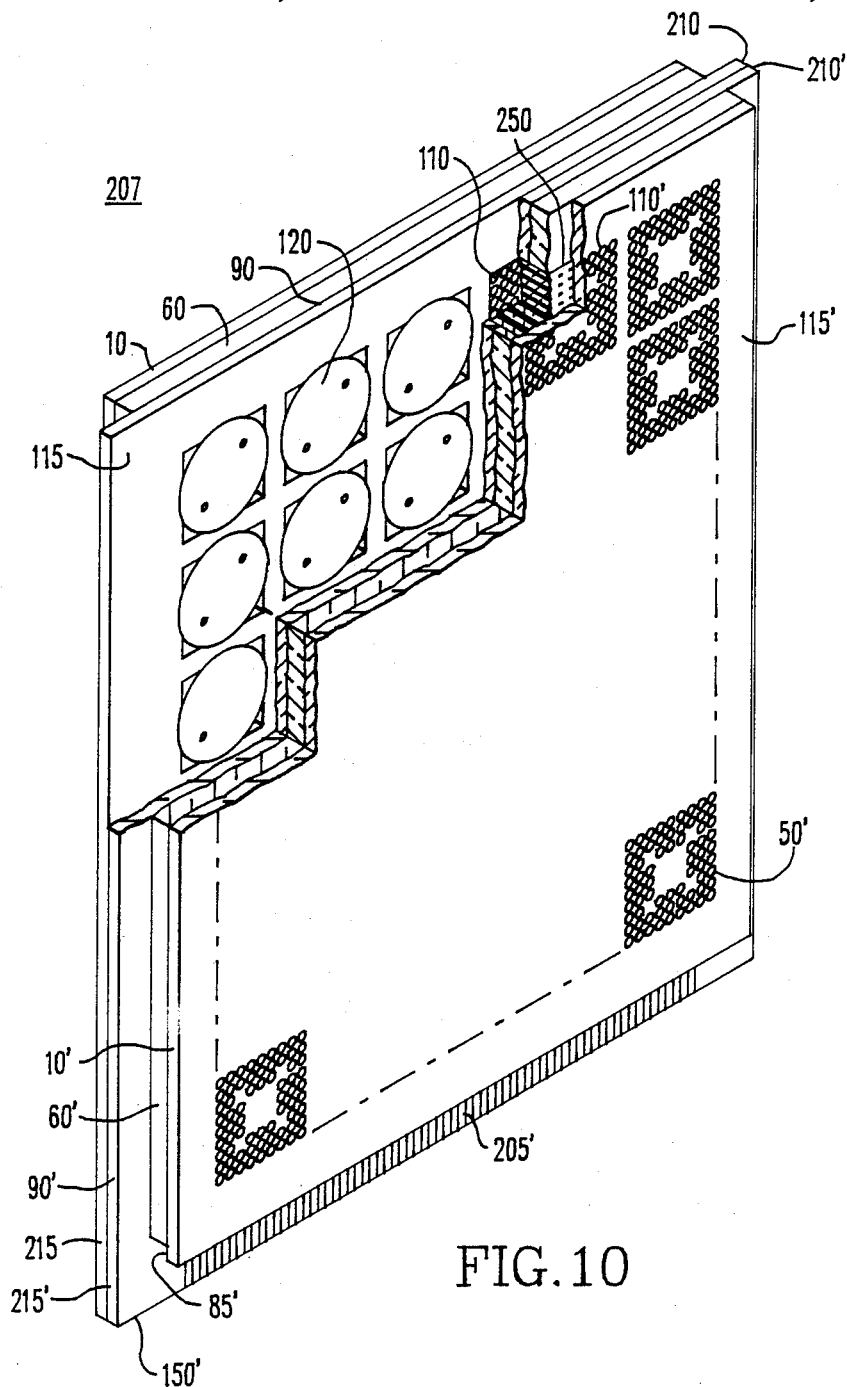
FIG. 10 shows an isometric view of two PWB modules, each with its heat conductive member contacting the other to form a PWB module pair.

What has just been described is a single PWB module. The design of an individual PWB module is such that a module pair may easily be constructed by assembling two individual PWB modules. As shown in FIG. 10, a first PWB module 115 and a similar second PWB module 115' both similar to that PWB module shown in FIG. 3, may be placed next to one another such that their respective heat conductive members 90 and 90' are adjacent to and contacting one another to form a PWB module pair 207.

Figure 11:
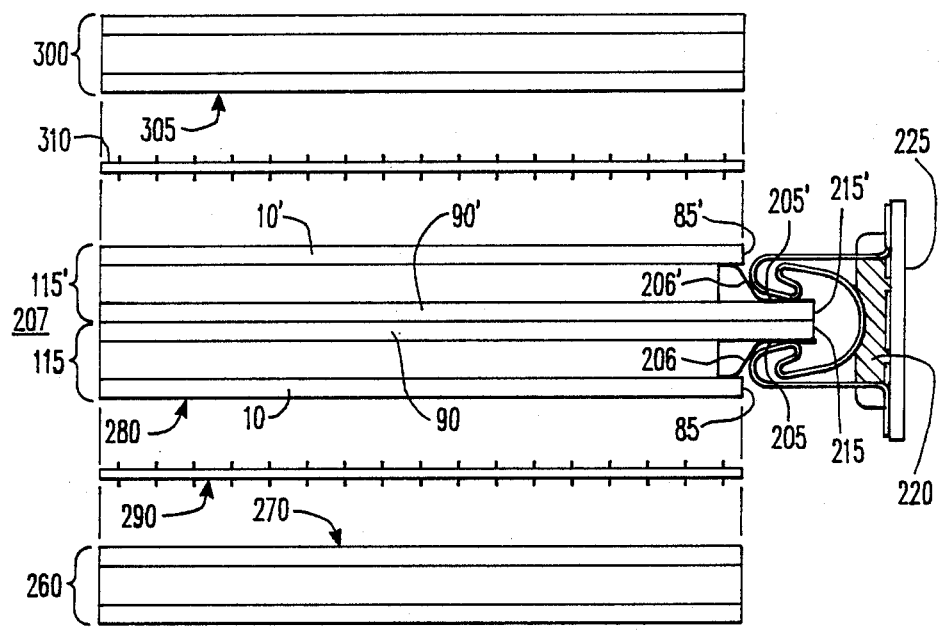
FIG. 11 illustrates an exploded view of an assembly which combines a plurality of modules to form a multi-module assembly.

Just as shown in the PWB module 115 in FIG. 3, each PWB module 115 and 115' in FIG. 10 has two heat conductive member extended edges 210, 210' and 215, 215'. Furthermore, each PWB module 115 and 115' has a PWB extended edge 85 (not shown), 85'. A third heat conductive member extended edge 150 (not shown), 150' has upon it connector pads 205 (not shown), 205'. A side view of the PWB module pair 207 shown in FIG. 10 is shown in FIG. 11. The PWB extended edges 85, 85' have connector pads 45 electrically attached to the heat conductive material connector pads 205, 205' located on the surface of the third heat conductive member extended edge 215, 215' through a plurality of wires 206, 206'. One advantage of this configuration is that the carriers, with the heat conductive members 90, 90' against each other, are essentially protected from dust and debris which may enter through the apertures of the heat conductive members. Furthermore this configuration protects the compressing covers 120 from excessive handling which may dislodge or loosen the covers 120.

As shown in FIG. 11, the module pair 207 may be electrically connected to an external source utilizing a typical electrical connector 220 such as a ZIF (zero insertion force) connector. The connector 220 may furthermore have a back plane 225 such that the entire module pair 207 may be connected to a mother board. As earlier discussed, the heat conductive member extended edges 210, 210' and 215, 215' may be attached to a heat sink to enhance heat transfer through the heat conductive members 90 and 90'.

Returning to FIG. 10 a unique feature provided by the PWB module 115, 115' design is that the two modules may be secured such that the heat conductive members 90, 90' are adjacent to one another and the modules 115, 115' may be electrically interconnected through the use of a compliant solderless interface utilized in the place of two adjacent component carriers and the associated items necessary to secure them. The linking compliant solderless interface 250 is of a design typical to that shown in FIG. 9. FIG. 10 shows the linking compliant solderless interface 250 in position filling the adjacent empty cavities 110 and 110' of two PWB modules 115 and 115'. Each cavity 110 and 110' is still bounded by a PWB first surface having a predetermined pad pattern. However, rather than these PWB pads being connected to the contact pads of an electronic component carrier, these pads are connected to the uniaxial conductive wires (199 of FIG. 9) on the linking compliant solderless interface 250 such that each pad is electrically connected to an opposite pad on the facing PWB surface. The depth of the linking compliant solderless interface 250 is sized such that it is slightly greater than the sum of the thicknesses of the heat conductive member and the dielectric spacing member of each of the PWB modules 115 and 115'. In this manner, when the two PWB modules 115 and 115' are placed against one another, the linking compliant solderless interface 250 experiences compression thereby providing an electrical link between the two PWBs.

Just as the individual PWB modules are secured through mechanical means such as screws extending through the thicknesses and secured with a nut at an end or with epoxy between the layers, so to is a PWB module pair 207.

Furthermore, note the test pads 50' shown on the second PWB module 115'. These are similar to the test pads 50 shown in the cross-section view of FIG. 6. Each test pad 50' represents an associated interconnect pad (25 in FIG. 6) on the opposite side of the PWB 10'. In this manner, once the PWB module pair 207 is assembled, it is possible to test individually each of the electronic components, relative to their interaction with the surrounding components, within their carriers even though the components are now completely enclosed within the PWB module pair 207.

Figure 12:
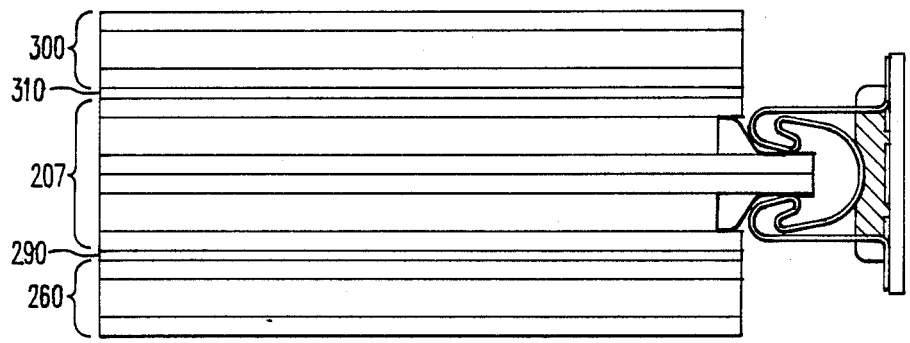
FIG. 12 illustrates the exploded view of FIG. 11 in an assembled multi-module arrangement.

While a PWB module pair 207 has been shown in FIG. 10, it is possible to add additional PWB modules to a PWB module pair. Given the PWB module pair 207 shown in FIG. 11, recall that test pads 50' are on an exposed surface of the PWB module 115' and, although not shown in FIG. 10, test pads 50 are on an exposed surface of the PWB module 115. Positioning a third PWB module 260 so that the module surface 270 on which the test pads are located is facing and aligned with the surface 280 having test pads of the first PWB module 115, which actually is the second surface 20 of the PWB 10, then a multiconnecting compliant solderless interface 290, similar to that shown in FIG. 9 but extending over a surface larger than that used within a module cavity, may be used to connect any test pads which are aligned between surface 270 and surface 280. An insulating layer may be laid over any portions of the multiconnecting compliant solderless interface 290 in which no electrical contact between aligned test pads is desired. The third PWB module 260 may be secured to the module pair 207 using a mechanical means such as screws and nuts extending therethrough or with epoxy as discussed earlier, however for easy disassembly it is preferred to use the screw and nut mechanical means. Just as PWB module 260 has been attached to the module pair 207, so can PWB module 300 be connected to the module pair 207 by contact with test pads on the surface 305 of the PWB module 115' utilizing a second multiconnecting compliant solderless interface 310. FIG. 12 shows the individual PWBs of FIG. 11 assembled together to form a multi-mode assembly.

Note that the multi-module assembly shown in FIG. 11 illustrate two different types of module attachment. The module pair 207 shown in FIG. 10 is mated such that the two heat conductive members 90, 90' are placed face to face and electrically connected by including in one of the cavities a linking compliant solderless interface (250 in FIG. 10).

On the other hand, the third PWB module 260 attached to the first PWB module 115 of the module pair 207 is attached such that the surfaces of PWBs 10, 10' having test pads are electrically connected to one another. This is done through the use of use of a multiconnecting compliant solderless interface 290 or 310 which essentially is the same as a linking compliant solderless interface although potentially much larger since it may attach more than one pattern of test pads to an adjacent pattern of test pads on another PWB module, just as a plurality of linking compliant solderless interfaces may be necessary to connect a module pair 207. With this in mind, it should be realized that the configuration shown in FIG. 10 could just as easily have shown the heat conductive members 90 and 90' as outside surfaces as opposed to the test pad surfaces now shown as external surfaces in FIG. 10. It should therefore be realized that either combination of heat conductive member to heat conductive member surfaces or PWB to PWB surfaces could be used to construct a PWB module pair or a PWB multi-module pair. Furthermore while an assembly using only four modules 115, 115', 260 and 300 is shown in FIG. 11 and FIG. 12, it should be understood that more modules may be added to the assembly in the same manner as shown in these figures.

Although this invention has been described with reference to a specific embodiment thereof, numerous modifications are possible without departing from the invention, and it is desirable to cover all modifications falling within the spirit and the scope of this invention.

What we claim is:

1. A solderless PWB module comprising:

(a) a planar PWB having a first surface, a thickness and an opposite second surface, the first surface having a plurality of sets of electrically conductive interconnect pads with each set of pads occupying an area on the surface, situated in a predetermined location upon the PWB and arranged in a predetermined pad pattern to correspond with the contacts pads of a mating electronic component carrier, (b) a planar dielectric spacing member having a first surface, a thickness and an opposite second surface, the second surface adjacent to and contacting the PWB first surface and the spacing member having carrier apertures therethrough, each aperture aligned with the predetermined pad pattern for the contact pads of an associated mating electronic component carrier and each aperture having a shape and an area approximately equal to that of the mating electronic component carrier such that the contact pads of a component carrier when the carrier is inserted within the aperture will be aligned with the corresponding predetermined PWB pad pattern, (c) a planar heat conductive member having a first surface, a thickness and an opposite second surface, the second surface adjacent to and contacting the dielectric spacing member first surface and the conductive member having carrier apertures therethrough, each aperture aligned with the predetermined pad pattern for the contact pads of the associated mating electronic component carrier and having a shape and are approximately equal to the spacing member apertures such that a cavity is formed through each aperture for receiving the associated mating electronic component carrier, each cavity having walls through the spacing member and through the conductive member and having a cavity floor at the PWB first surface, (d) means for holding the PWB, the dielectric spacing member and the heat conductive member in a fixed position relative to one another, (e) securing means for holding an associated electronic component carrier within a cavity such that the pad pattern on the PWB electrically contacts the contact pads of the mating electronic component carrier and such that a heat transfer path exists from the electronic component carrier to the heat conductive member.

2. The apparatus as recited in claim 1, wherein the securing means is comprised of a compressing cover of a thermally conductive material secured to the heat conductive member at the cavity opening and a component compliant solderless interface situated between the electronic component carrier and the PWB such that the cover acts to compress the component solderless interface between the PWB interconnect pads and the electronic component carrier contact pads for electrical contact and furthermore the cover acts to contact the component carrier and provide heat transfer through the cover to the heat conductive member.

3. The apparatus as recited in claim 2, wherein the securing means is further comprised of a compliant thermally conductive interface between the cover and the electronic component carrier such that the cover further acts to compress the thermally conductive interface between and conform the interface to the cover and the electronic component carrier for heat transfer.

4. The apparatus as recited in claim 3, wherein the portion of the cavity wall defined by a carrier aperture through the heat conductive member is threaded and the compressing cover is a circular plate having mating threads to the cavity wall such that the cover is secured to the heat conductive member through threaded engagement with the heat conductive member.

5. The apparatus as recited in claim 3, wherein the compressing cover is a plate having an area less than that the heat conductive member aperture and is secured within the aperture of the conductive member using conductive epoxy.

6. The apparatus as recited in claim 3, wherein the compressing cover is a plate having an area approximately equal to that of the heat conductive member aperture such that the cover may be forcibly inserted into the aperture and held in place through friction between the cover and the cavity wall.

7. The apparatus as recited in claim 1, wherein the PWB further includes at least one set of electrical component interconnect pads occupying an area on the first surface of the PWB, situated in a predetermined location upon the PWB and in a predetermined pad pattern to correspond with the contact pads of a corresponding passive electronic component carrier, the heat conductive member further having a component aperture therethrough for the at least one component, the aperture aligned with the predetermined pad pattern such that the component may be within the aperture, secured to the PWB interconnect pads and fully enclosed.

8. The apparatus as recited in claim 1, wherein the PWB further includes vias extending through the PWB thickness at the locations of the interconnect pads such that an identical predetermined pad pattern exists on the PWB second surface opposite to that pattern on the PWB first surface and an electrical component carrier within the PWB module may be electrically tested relative to its interaction with surrounding components without removing that component carrier from the module.

9. A solderless PWB module comprising:
(a) a planar PWB having a first surface, a thickness and an opposite second surface, the first surface having a plurality of sets of electrically conductive interconnect pads with each set of pads occupying an area on the surface, situated in a predetermined location upon the PWB and arranged in a predetermined pad pattern to correspond with the contacts pads of a mating electronic component carrier, (b) a planar dielectric spacing member having a first surface, a thickness and an opposite second surface, the second surface adjacent to and contacting the PWB first surface and the spacing member having carrier apertures therethrough, each aperture aligned with the predetermined pad pattern for the contact pads of an associated mating electronic component carrier and each aperture having a shape and an area approximately equal to that of the mating electronic component carrier such that the contact pads of a component carrier when the carrier is inserted within the aperture will be aligned with the corresponding predetermined PWB pad pattern, (c) a planar heat conductive member having a first surface, a thickness and an opposite second surface, the second surface adjacent to and contacting the dielectric spacing member first surface and the conductive member having carrier apertures therethrough, each aperture aligned with the predetermined pad pattern for the contact pads of the associated mating electronic component carrier and having a shape and area approximately equal to the spacing member apertures such that a cavity is formed through each aperture for receiving the associated mating electronic component carrier, each cavity having walls through the spacing member and through the conductive member and having a cavity floor at the PWB first surface, (d) means for holding the PWB, the dielectric spacing member and the heat conductive member in a fixed position relative to one another, (e) securing means for holding an associated electronic component carrier within a cavity such that the pad pattern on the PWB electrically contacts the contact pads of the mating electronic component carrier and such that a heat transfer path exists from the electronic component carrier to the heat conductive member, wherein the securing means is comprised of a compressing cover of a thermally conductive material secured to the heat conductive member at the cavity opening and a component compliant solderless interface situated between the electronic component carrier and the PWB such that the cover acts to compress the component solderless interface between the PWB interconnect pads and the electronic component carrier contact pads for electrical contact and furthermore the cover acts to contact the component carrier and provide heat transfer through the cover to the heat conductive member, and the securing means is further comprised of a compliant thermally conductive interface between the cover and the electronic component carrier such that the cover further acts to compress the thermally conductive interface between and conform the interface to the cover and the electronic component carrier for heat transfer.

10. A solderless PWB module pair comprising:
(a) a first and a second PWB module, each having
 (i) a planar PWB having a first surface, a thickness and an opposite second surface, the first surface having a plurality of sets of electrically conductive interconnect pads with each set of pads occupying an area on the surface, situated in a predetermined location upon the PWB and arranged in a predetermined pad pattern to correspond with the contacts pads of a mating electronic component carrier,
 (ii) a planar dielectric spacing member having a first surface, a thickness and an opposite second surface, the second surface adjacent to and contacting the PWB first surface and the spacing member having carrier apertures therethrough, each aperture aligned with the predetermined pad pattern for the contact pads of an associated mating electronic component carrier and each aperture having a shape and an area approximately equal to that of the mating electronic component carrier such that the contact pads of a component carrier when the carrier is inserted within the aperture will be aligned with the corresponding predetermined PWB pad pattern,
 (iii) a planar heat conductive member having a first surface, a thickness and an opposite second surface, the second surface adjacent to and contacting the dielectric spacing member first surface and the conductive member having carrier apertures therethrough, each aperture aligned with the predetermined pad pattern for the contact pads of the associated mating electronic component carrier and having a shape and area approximately equal to the spacing member apertures such that a cavity is formed through each aperture for receiving the associated mating electronic component carrier, each cavity having walls through the spacing member and through the conductive member and having a cavity floor at the PWB first surface,
 (iv) means for holding the PWB, the dielectric spacing member and the heat conductive member in a fixed position relative to one another and
 (v) securing means for holding an associated electronic component carrier within a cavity such that the pad pattern on the PWB electrically contacts the contact pads of the mating electronic component carrier and such that a heat transfer path exists from the electronic component carrier to the heat conductive member and
(b) connecting means to secure the first PWB module to the second PWB module such that a planar surface of the first module is in contact with a planar surface of the second module.

11. A solderless PWB module pair as recited in claim 10 further comprising
(a) the first PWB module having
 (i) the PWB with at least one set of electrically conductive linking pads in a predetermined location upon the PWB first surface and in a predetermined pad pattern of known size and area,
 (ii) the dielectric spacing member with an additional aperture therethrough aligned with and having the same size and area as the linking pad pattern and
 (iii) the heat conductive member with an additional aperture therethrough aligned with and having the same size and area as the linking pad pattern, such that a cavity having a depth is formed through the dielectric spacing member aperture and the heat conductive member aperture, the cavity having walls through the spacing member and through the conductive member and having a cavity floor at the PWB first surface and
(b) the second PWB module having
 (i) the PWB with at least one set of electrically linking pads in a predetermined location upon the PWB first surface and in a predetermined pad pattern of known size and area such that the first PWB module linking pads align with the second PWB module linking pads when the heat conductive member first surfaces are adjacent to and in contact with one another,
 (ii) the dielectric spacing member with an additional aperture therethrough aligned with and having the same size and area as the linking pad pattern and
 (iii) the heat conductive member with an additional aperture therethrough aligned with and having the same size and area as the linking pad pattern, such that a cavity having a depth is formed through the dielectric spacing member aperture and the heat conductive member aperture, the cavity having walls through the spacing member and through the conductive member and having a cavity floor at the PWB first surface,
(c) at least one board compliant solderless interface having an area approximately equal to that of the apertures and having a depth greater than the combined depth of the cavities in the first and second PWB modules, the board compliant interface positioned within the two cavities of aligned linking pads such that the interface will provide electrical connection between the first PWB module and the second PWB module and (d) the connecting means securing the first PWB module to the second PWB module such that the first surface of the two heat conductive members are adjacent to and contacting with one another.

12. A solderless PWB module pair as recited in claim 10 further comprising (a) the PWB of the first module having at least one set of electrically conductive linking pads in a predetermined location upon the PWB second surface and in a predetermined pad pattern of known size and area, (b) the PWB of the second module positioned with the PWB second surface adjacent to and in contact with the first PWB module PWB second surface, the PWB of the second module further having at least one set of electrically conductive linking pads in a predetermined location upon the PWB second surface and in a predetermined pad pattern of known size and area such that the first module PWB linking pads align with the second module PWB linking pads when the PWB second surface of each module is adjacent to and in contact with the other and (c) a compliant solderless interface having an area approximately equal to that of the pad patterns, the board compliant interface positioned between the two sets of linking pads such that the interface will provide electrical connection between the first PWB module and the second PWB module and (d) the connecting means securing the first module the second module such that the second surface of each PWB is adjacent to and contacting with the other.

13. A solderless PWB module group comprised of (a) a PWB module pair comprising a first and a second PWB module, each having (i) a planar PWB having a first surface, a thickness and an opposite second surface, the first surface having a plurality of sets of electrically conductive interconnect pads with each set of pads occupying an area on the surface, situated in a predetermined location upon the PWB and arranged in a predetermined pad pattern to correspond with the contacts pads of a mating electronic component carrier, (ii) a planar dielectric spacing member having a first-surface, a thickness and an opposite second surface, the second surface adjacent to and contacting the PWB first surface and the spacing member having carrier apertures therethrough, each aperture aligned with the predetermined pad pattern for the contact pads of an associated mating electronic component carrier and each aperture having a shape and an area approximately equal to that of the mating electronic component carrier such that the contact pads of a component carrier when the carrier is inserted within the aperture will be aligned with the corresponding predetermined PWB pad pattern, (iii) a planar heat conductive member having a first surface, a thickness and an opposite second surface, the second surface adjacent to and contacting the dielectric spacing member first surface and the conductive member having carrier apertures therethrough, each aperture aligned with the predetermined pad pattern for the contact pads of the associated mating electronic component carrier and having a shape and area approximately equal to the spacing member apertures such that a cavity is formed through each aperture for receiving the associated mating electronic component carrier, each cavity having walls through the spacing member and through the conductive member and having a cavity floor at the PWB first surface, (iv) means for holding the PWB, the dielectric spacing member and the heat conductive member in a fixed position relative to one another and (v) securing means for holding an associated electronic component carrier within a cavity such that the pad pattern on the PWB electrically contacts the contact pads of the mating electronic component carrier and such that a heat transfer path exists from the electronic component carrier to the heat conductive member and (b) connecting means to secure the first PWB module to the second PWB module such that a planar surface of the first module is in contact with a planar surface of the second module, (c) a third PWB module connected electrically and mechanically to the first PWB module and (d) a fourth PWB module connected electrically and mechanically to the second PWB module.

* * * * *